(12) United States Patent
Okaji

(10) Patent No.: US 8,318,597 B2
(45) Date of Patent: Nov. 27, 2012

(54) MANUFACTURING METHOD OF SEMICONDUCTOR DEVICE INCLUDING AU BUMP ON SEED FILM

(75) Inventor: Shigeharu Okaji, Shiga (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 12/801,245

(22) Filed: May 28, 2010

(65) Prior Publication Data

US 2010/0330796 A1   Dec. 30, 2010

(30) Foreign Application Priority Data

Jun. 30, 2009  (JP) ................................. 2009-155369

(51) Int. Cl.
*H01L 21/44* (2006.01)

(52) U.S. Cl. ........ 438/614; 438/612; 438/613; 438/622; 438/108; 257/737; 257/778; 257/734; 257/751; 257/781

(58) Field of Classification Search .................. 257/781, 257/782, 784, 778, 758, 736, 734, 737, 738, 257/780, 774, 735, 750, 751, 783, 776; 438/614, 438/617, 108, 118, 622, 613, 612

See application file for complete search history.

(56) References Cited

U.S. PATENT DOCUMENTS

| | | | | |
|---|---|---|---|---|
| 5,841,568 A * | 11/1998 | Miyakawa | ...................... | 359/245 |
| 6,415,974 B2 * | 7/2002 | Jao | .................. | 228/215 |
| 6,724,084 B1 * | 4/2004 | Hikita et al. | .................. | 257/737 |
| 7,381,636 B2 * | 6/2008 | Wang | ............................. | 438/612 |
| 2003/0124832 A1 * | 7/2003 | Tseng et al. | .................. | 438/613 |
| 2006/0192299 A1 * | 8/2006 | Hashimoto | .................... | 257/782 |
| 2008/0054457 A1 * | 3/2008 | Lin et al. | ....................... | 257/737 |

FOREIGN PATENT DOCUMENTS

JP   3-208347   9/1991

* cited by examiner

*Primary Examiner* — Ha Tran T Nguyen
*Assistant Examiner* — Thanh Y Tran
(74) *Attorney, Agent, or Firm* — McGinn IP Law Group, PLLC

(57) ABSTRACT

The manufacturing method includes: forming a seed film on a semiconductor chip; forming a photoresist having an opening above an electrode of the semiconductor chip on the seed film; forming a first Au bump on the seed film in the opening by electrolytic plating with a current density of 1.5 A/dm² or above; grinding a surface of the first Au bump; stripping the photoresist; and removing the seed film by dry-etching.

18 Claims, 8 Drawing Sheets

US 8,318,597 B2

MANUFACTURING METHOD OF SEMICONDUCTOR DEVICE INCLUDING AU BUMP ON SEED FILM

INCORPORATION BY REFERENCE

This patent application is based on Japanese Patent Application No. 2009-155369. The disclosure of the Japanese Patent Application is incorporated herein by reference.

BACKGROUND OF THE INVENTION

1. Field of the Invention

The present invention relates to a semiconductor device manufacturing method and more specifically to a bump forming method.

2. Description of Related Art

As a method of connecting a semiconductor chip and a wiring board in a semiconductor device manufacturing process, there is a method called gang bonding by which projecting electrodes (hereinafter referred to as bumps) of, for example, Au, solder, or Cu formed on the semiconductor chip and leads of the wiring board are collectively connected together. The gang bonding is also widely used in COG (Chip On Glass) in which a semiconductor chip is directly attached to a glass substrate. For the gang bonding, the following kinds of bump are used: a stud bump used in a wire bonding technique; and a mushroom bump and a straight bump used in a plating technique. The straight bump is frequently used since it is advantageous for miniaturizing.

Japanese Patent Application Publication JP-A-Heisei 3-208347, which is referred to as Patent Document 1, discloses a technique related to a straight bump forming method. The bump forming method of Patent Document 1 is characterized by first performing plating on a wafer where a resist pattern is formed with a high current density, then performing plating while gradually reducing the current density, and finally performing plating with a relatively low current density. Such a bump forming method can shorten the plating time and can also reduce the hardness of a top part of a bump.

SUMMARY

A bump forming method by electrolytic plating may cause height variation among a plurality of formed bumps, due to nonuniformity of metal concentration caused by inadequate plating solution circulation or nonuniformity of electric field strength in the plating solution. The height variation among the plurality of bumps is likely to cause connection failure upon bonding of the semiconductor chip and the wiring board, which leads to a risk of deteriorating reliability of the semiconductor device.

Associated with the above problem, according to an aspect of the present invention, A manufacturing method of a semiconductor device includes: forming a seed film on a semiconductor chip; forming a photoresist having an opening above an electrode of the semiconductor chip on the seed film; forming a first Au bump on the seed film in the opening by electrolytic plating with a current density of 1.5 A/dm$^2$ or above; grinding a surface of the first Au bump; stripping the photoresist; and removing the seed film by dry-etching.

In such a manufacturing method, a plurality of first Au bumps are formed by electrolytic plating with high current density, and the surfaces thereof are processed by grinding. A plurality of first Au bumps being formed by the electrolytic plating with high current density and having flat surfaces hardly arises a difference in dry etching of seed film so that it is possible to prevent height variation among the plurality of first Au bumps.

As a result, the semiconductor device manufacturing method of the present invention can form a plurality of Au bumps with their height aligned.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

Hereinafter, a semiconductor device manufacturing method according to some exemplary embodiments of the present invention will be described referring to the accompanying drawings. The semiconductor device manufacturing method of the embodiments described below relates to a bump forming process. For other manufacturing processes, well-known techniques can be used.

First Embodiment

Figure 1:
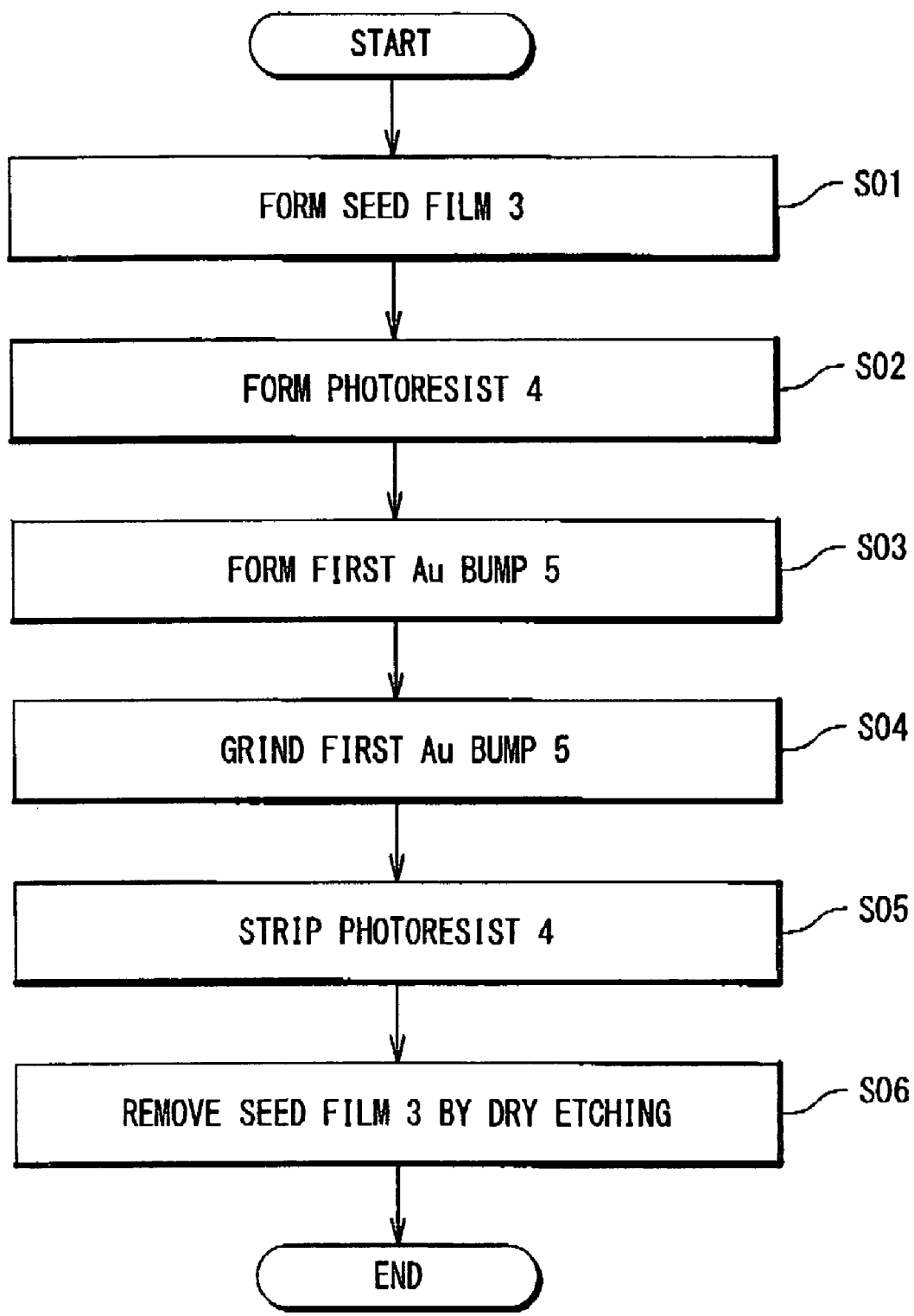
FIG. 1 is a flowchart showing a semiconductor device manufacturing method according to a first embodiment of the present invention.

FIG. 1 is a flowchart showing the semiconductor device manufacturing method according to a first embodiment of the present invention. The first embodiment of the present invention will be described, referring to each of the processes shown in FIG. 1.

Figure 2A:
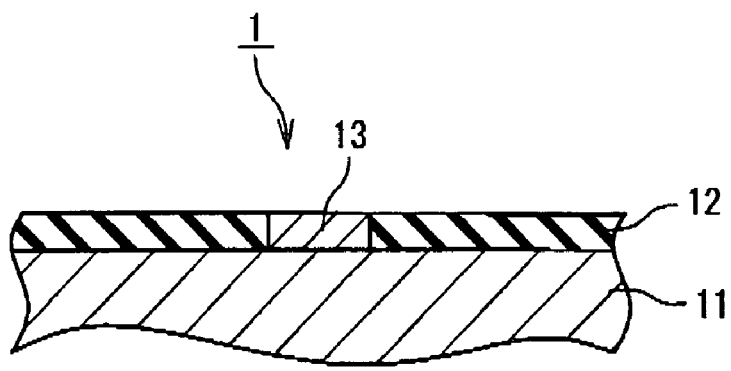
FIGS. 2A, 2B, and 2C are diagrams showing processes of forming a seed film 3 on a semiconductor chip 1.
Figure 2B:
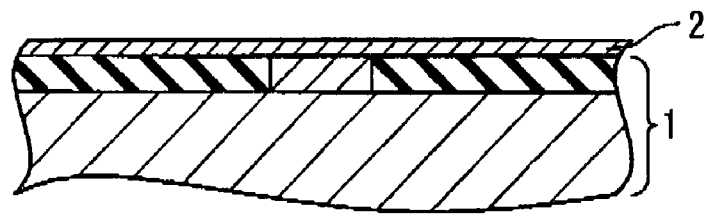
Figure 2C:
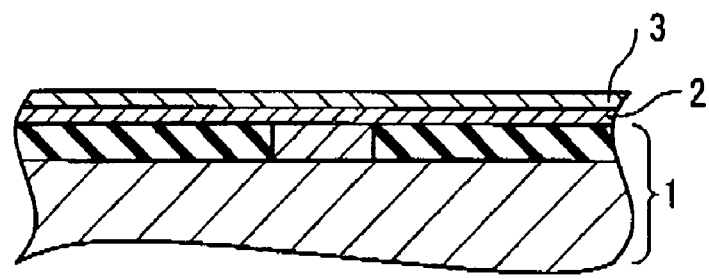

Step S01:

A seed film is formed on a semiconductor chip. FIGS. 2A, 2B, and 2C are diagrams showing some processes of forming a seed film 3 on a semiconductor chip 1. Referring to FIGS. 2A, 2B, and 2C, the process of forming the seed film 3 on the semiconductor chip 1 will be described. FIG. 2A is a partial sectional view of the semiconductor chip 1 where the seed film 3 is to be formed. Referring to FIG. 2A, the semiconductor chip 1 is provided with: a wafer 11, an insulation layer 12, and an electrode 13. On the silicon wafer 11, transistors and wirings are formed to realize various functions as the semiconductor chip 1. The insulation layer 12 covers the wafer 11 without covering the electrode 13 and prevents mutual contact between wirings. The electrode 13 is formed on the wafer 11 to connect the wafer 11 with outside and made of aluminum and so on.

FIG. 2B is a partial sectional view of the semiconductor chip 1, where a barrier film 2 is formed. Referring to FIG. 2B, the barrier film 2 is formed by a spattering method to cover the semiconductor chip 1 (insulation layer 12 and electrode 13) shown in FIG. 2A. The barrier film 2 is adhesively attached to the insulation layer 12 and the electrode 13 to prevent separation of a first Au bump 5 formed in a later process. The barrier film 2 is made of, for example, Ti or TiW.

FIG. 2C is a partial sectional view of the semiconductor chip 1 where the seed film 3 is formed. Referring to FIG. 2C, the seed film 3 is formed by a spattering method to cover the barrier film 2 shown in FIG. 2B. The seed film 3 is a metal serving as an electrode at the electrolytically plating the first Au bump 5 formed in a later process. The seed film 3 is made of, for example, Au. In this manner, the seed film 3 is formed on the semiconductor chip 1.

Figure 3:
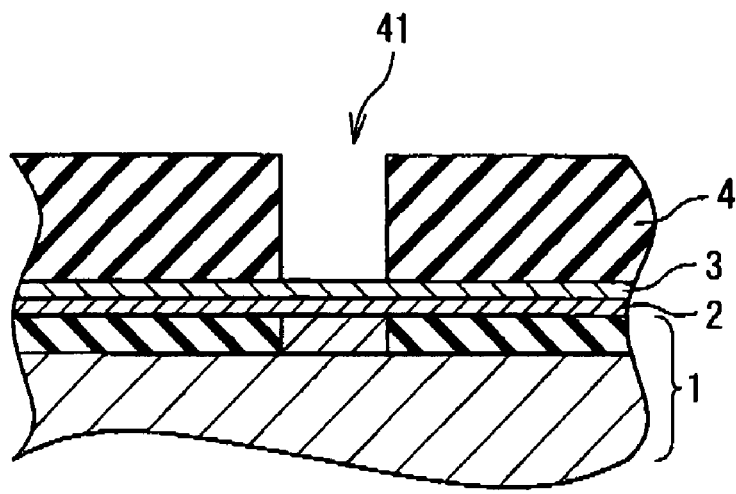
FIG. 3 is a sectional view of the semiconductor chip 1 including a photoresist 4 formed on the seed film 3.

Step S02:

A photoresist is formed on the seed film. FIG. 3 is a sectional view of the semiconductor chip 1 including a photoresist 4 formed on the seed film 3. Referring to FIG. 3, a process of forming the photoresist 4 on the seed film 3 will be described. The photoresist 4 is applied onto the seed film 3. The thickness of the photoresist 4 is based on the height of the first Au bump 5 formed in a later process. The photoresist 4, after pre-baked, is exposed to light through a mask including a pattern of the first Au bump 5. After the exposure, unnecessary portions of the photoresist 4 are removed. An opening part 41 is a portion formed by removing the unnecessary portions of the photoresist 4. The opening part 41 is formed in accordance with the electrode 13 positioned below the opening part 41. In this manner, the photoresist 4 having the opening part 41 above the electrode 13 of the semiconductor chip 1 is formed on the seed film 3.

Figure 4:
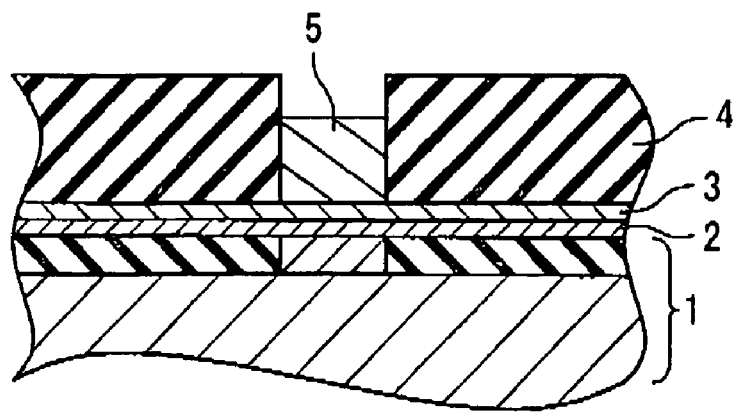
FIG. 4 is a sectional view of the semiconductor chip 1 where a first Au bump 5 is formed.

Step S03:

The first Au bump 5 is formed on the seed film 3 in the opening part 41 shown in FIG. 3, based on electrolytic plating with a current density of 1.5 A/dm² or above. FIG. 4 is a sectional view of the semiconductor chip 1 where the first Au bump 5 is formed. The electrolytic plating is performed under the following conditions. The plating solution composition that realizes the following chemical responses (1) to (4) is used under the temperature of 40 to 65° C. The concentration of Au in the plating solution is, for example, 12 g/L, 14 g/L, or 16 g/L so as to cope with a high current density.

(1) 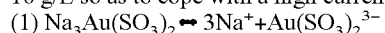 $Na_3Au(SO_3)_2 \leftrightarrow 3Na^+ + Au(SO_3)_2^{3-}$
(2) 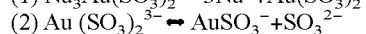 $Au(SO_3)_2^{3-} \leftrightarrow AuSO_3^- + SO_3^{2-}$
(3) 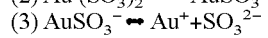 $AuSO_3^- \leftrightarrow Au^+ + SO_3^{2-}$
(4) $Au^+ + e^- \rightarrow Au$ (Au is extracted as a result of charge transfer).

In the process (step S03) of manufacturing the first Au bump 5 based on the electrolytic plating, the current density is 1.5 A/dm² or above, which is based on a result of study by the inventor of the present invention. For the relationship between the current density for the electrolytic plating and change of a crystal direction of the formed first Au bump 5, the followings can be presumed. Note that the change denotes that the crystal direction varies (crystal axis direction is aligned) or crystal orientation varies (orientation is aligned).

When the first Au bumps 5 are formed by electrolytic plating with a current density of 1.0 A/dm² under the aforementioned electrolytic plating condition, the crystal directions of the first Au bumps 5 are partially changed based on the thermal history (80 to 150° C.). The thermal history corresponds to the amount of heat received by the first Au bump 5 in the later process of stripping the photoresist 4. When the first Au bumps 5 are formed with a current density of 1.5 A/dm² under the same electrolytic plating condition, the crystal directions of the first Au bumps are uniformly changed based on the same thermal history (80 to 150° C.). Further, when the first Au bumps 5 are formed with a current density of 2.0 A/dm² under the same electrolytic plating condition, the crystal directions of the first Au bumps 5 are uniformly changed based on the same thermal history (80 to 150° C.). That is, for the first Au bumps 5 formed with a current density of 1.5 A/dm² or above, temperature at which their crystal directions are changed becomes low, and due to the thermal history (80 to 150° C.) in the process of stripping the photoresist 4, the uniform change of the crystal directions occurs. The uniform change of the crystal directions is preferable in the process of dry-etching the seed film 3 and the barrier film 2 since there hardly arises a difference in etching rate among a plurality of the first Au bumps 5 formed simultaneously. Therefore, the first Au bump 5 is formed based on the electrolytic plating with a current density of 1.5 A/dm² or above.

Figure 5:
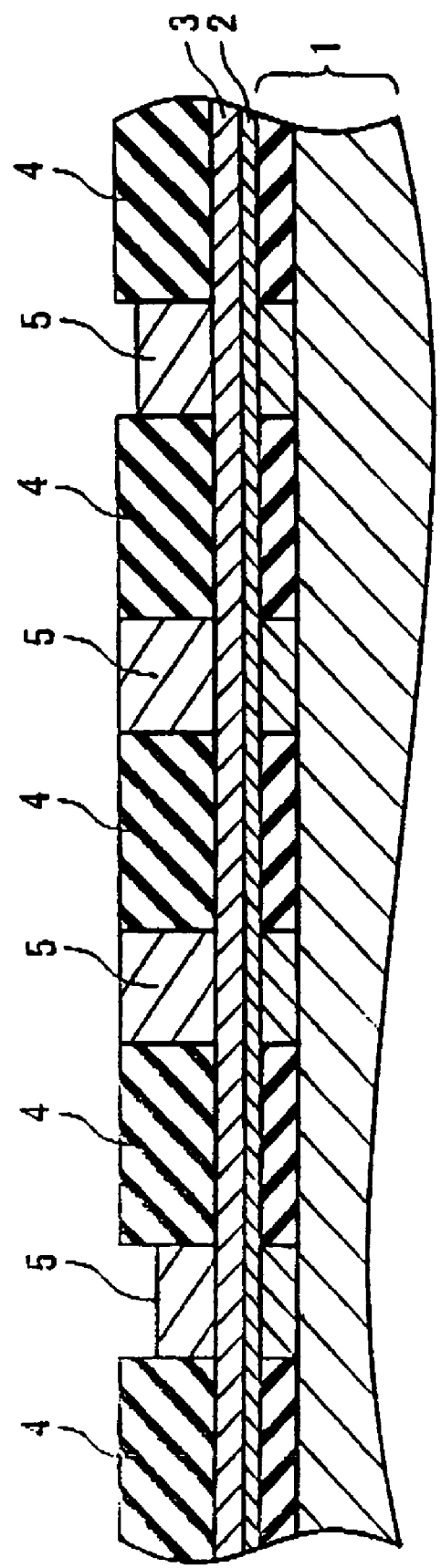
FIG. 5 is a sectional view of the semiconductor chip 1 including a plurality of Au bumps 5 formed based on electrolytic plating.

FIG. 5 is a sectional view of the semiconductor chip 1 including a plurality of first Au bumps 5 formed based on the electrolytic plating. Referring to FIG. 5, the plurality of first Au bumps 5 formed on the semiconductor chip 1 have mutually different heights. The current density for the electrolytic plating has an influence on the respective heights of the plurality of first Au bumps 5 formed. The inventor of the present invention found the following relationship between the current density for the electrolytic plating and height variation among the plurality of first Au bumps 5. When the current density for the electrolytic plating is less than 1.0 A/dm², the height variation among the plurality of first Au bumps 5 is smaller than that when the current density for the electrolytic plating is 1.5 A/dm². When the current density for the electrolytic plating is 1.5 A/dm², the height variation among the plurality of first Au bumps 5 occurs remarkably. Further, when the current density for the electrolytic plating is 2.0 A/dm², there appears abnormal growth of the plurality of first Au bumps 5, resulting in greater height variation among the plurality of first Au bumps 5 than that when the current density for the electrolytic plating is 1.5 A/dm². In the present embodiment, the current density for the electrolytic plating is 1.5 A/dm² or above, thus causing remarkable height variation among the plurality of first Au bumps 5.

Figure 6:
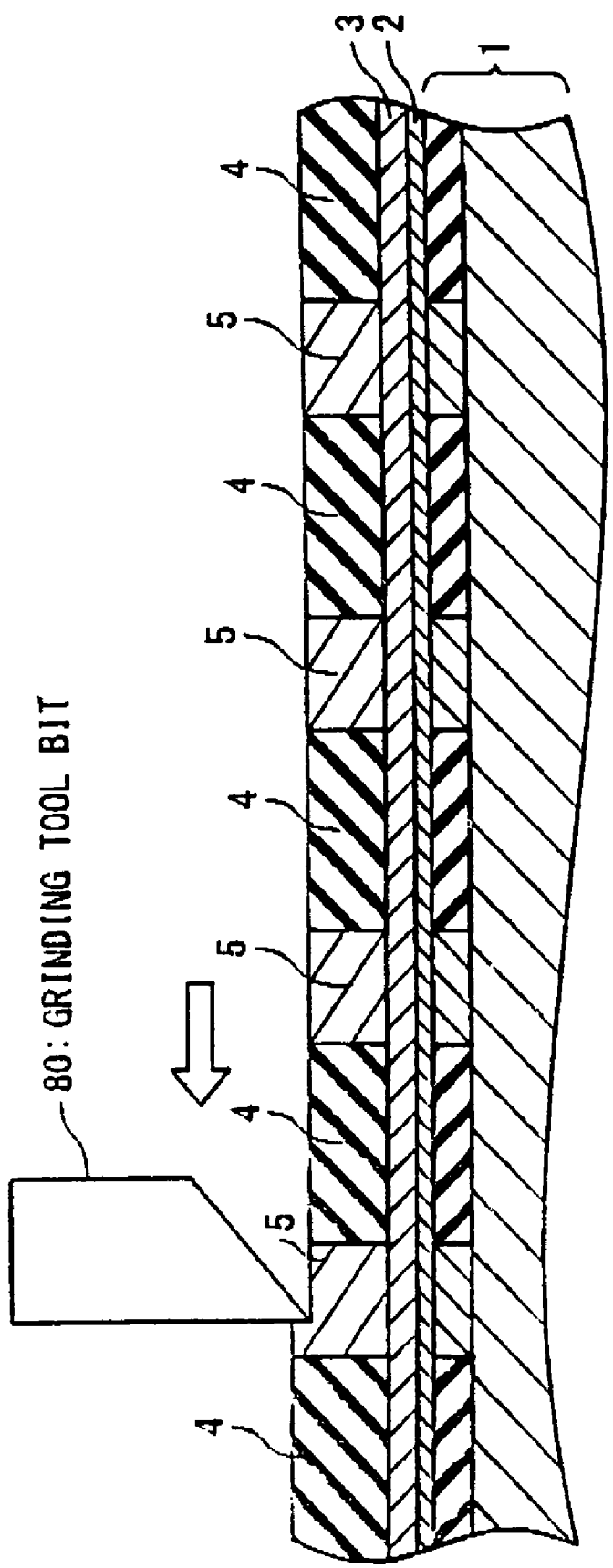
FIG. 6 is a sectional view of the semiconductor chip 1, where surfaces of the plurality of Au bumps 5 shown in FIG. 5 are ground flat.

Step S04:

The first Au bumps 5 are ground. To resolve the height variation among the plurality of first Au bumps 5, surfaces of the plurality of first Au bumps 5 are ground flat. FIG. 6 is a sectional view of the semiconductor chip 1, where the surfaces of the plurality of first Au bumps 5 are ground flat. Referring to FIG. 6, the surfaces of the plurality of first Au bumps 5 are ground with a grinding tool bit 80. The plurality of first Au bumps 5 subjected to the grinding consequently have flat surfaces with their heights aligned. Performing the electrolytic plating with a high current density of over 1.5 A/dm² is likely to cause height variation among the plurality of first Au bumps 5, but this variation can be resolved by grinding their surfaces.

Figure 7:
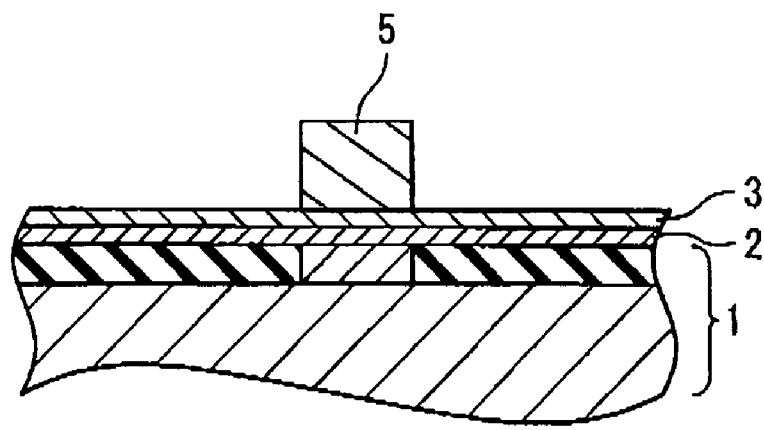
FIG. 7 is a partial sectional view of the semiconductor chip 1, where photoresist 4 is stripped from the semiconductor chip 1 including the Au bumps 5 having the surfaces processed by grinding.

Step 05:

The photoresist 4 is stripped based on an organic solvent or oxygen plasma ashing. FIG. 7 is a partial sectional view of the semiconductor chip 1, where the photoresist 4 has been stripped from the semiconductor chip 1 including the first Au bumps 5 having the ground surfaces. The semiconductor chip 1, the barrier film 2, the seed film 3, and the first Au bumps 5 are heated to approximately 80 to 180° C. upon the stripping of the photoresist 4 by using an organic solvent. In the case of adopting the oxygen plasma ashing, they are heated to approximately 150° C. Based on the thermal history of this process, the crystal directions of the plurality of first Au bumps 5 are changed uniformly.

Figure 8:
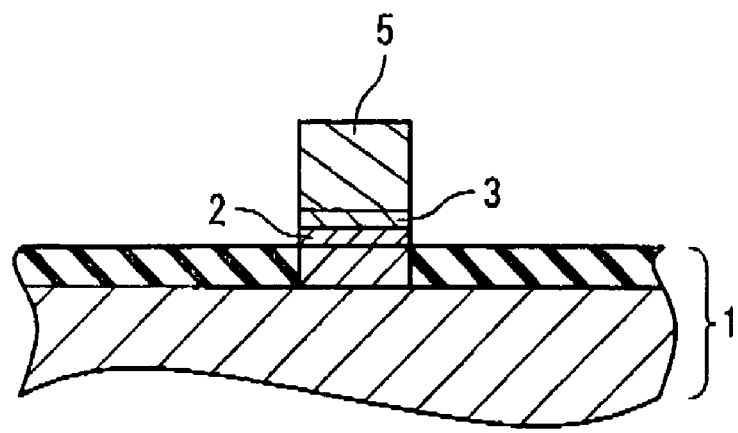
FIG. 8 is a sectional view of the semiconductor chip 1, where the seed film 3 and a barrier film 2 have been removed by dry etching.

Step S06:

The seed film 3 and the barrier film 2 are removed by the dry etching. FIG. 8 is a sectional view of the semiconductor chip 1, where the seed film 3 and the barrier film 2 have been removed by the dry etching. The first Au bump 5 is etched in the same manner when the seed film 3 and the barrier film 2 are dry-etched. However, since the crystal directions of the plurality of first Au bumps 5 formed by the semiconductor device manufacturing method of the present embodiment have been changed uniformly, there hardly arises a difference in etching rate among the plurality of first Au bumps 5. That is, the semiconductor device manufacturing method of the present embodiment provides an effect of preventing the height variation among the plurality of first Au bumps 5.

With the semiconductor device manufacturing method according to the first embodiment of the present invention, the plurality of first Au bumps 5 are formed based on electrolytic plating with a high current density. With the plurality of first Au bumps 5 formed by the electrolytic plating with a current density of 1.5 A/dm$^2$ or above, temperature at which their crystal directions are changed based on the thermal history declines, so that the crystal directions are uniformly changed in the process of stripping the photoresist 4. Moreover, the plurality of first Au bumps 5 formed based on the electrolytic plating with a high current density are likely to have remarkable height variation, but the height variation is resolved by the process of grinding their surfaces. The plurality of first Au bumps 5 formed in this manner hardly have an etching rate difference thereamong in the process of dry-etching the seed film 3 and the barrier film 2, which can prevent etching nonuniformity. That is, the semiconductor device manufacturing method of the present invention can easily form a plurality of first Au bumps 5 with their heights aligned. The plurality of first Au bumps 5 with their heights aligned do not cause failure in connection between the semiconductor chip 1 and a wiring board, thus providing an effect of improving reliability of a semiconductor device.

Second Embodiment

The semiconductor device manufacturing method according to a second embodiment of the present invention will be described. The second embodiment differs from the first embodiment in a method of forming an Au bump at an opening part 41. Therefore, components same as those of the first embodiment will be provided with the same numerals and overlapping description thereof will be omitted.

Figure 9:
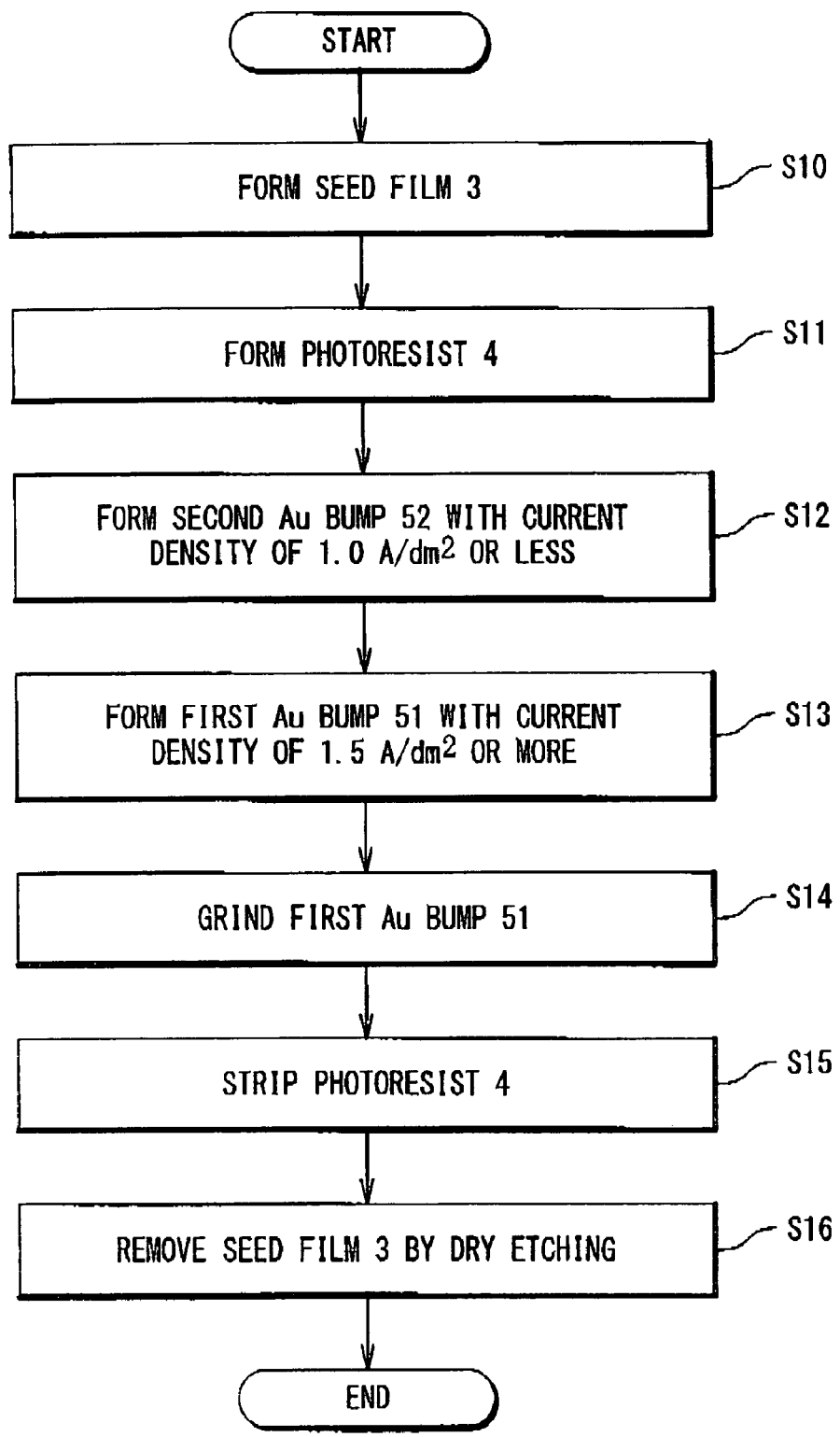
FIG. 9 is a flowchart showing a semiconductor device manufacturing method according to a second embodiment of the present invention.

FIG. 9 is a flowchart showing the semiconductor device manufacturing method according to the second embodiment of the present invention. The second embodiment of the present invention will be described, referring to each of the processes shown in FIG. 9.

Step S10:

A seed film 3 is formed on a semiconductor chip 1 (see FIG. 2C, and similar to step S01 of the first embodiment).

Step S11:

A photoresist 4 having the opening part 41 above an electrode 13 of the semiconductor chip 1 is formed on the seed film 3 (see FIG. 3, and similar to step S02 of the first embodiment).

Step S12:

Based on electrolytic plating with a current density of 1.0 A/dm$^2$ or below, a second Au bump 52 is formed on the seed film 3 in the opening part 41. The second Au bump 52 is formed to have at least half a height provided at time of Au bump completion. Since the current density is 1.0 A/dm$^2$ or below, for the second Au bump 52 formed in this process, Au bump variation can be kept lower than that when the current density is 1.5 A/dm$^2$ or above. The condition of the electrolytic plating is similar to that of the first embodiment of the present invention.

Figure 10:
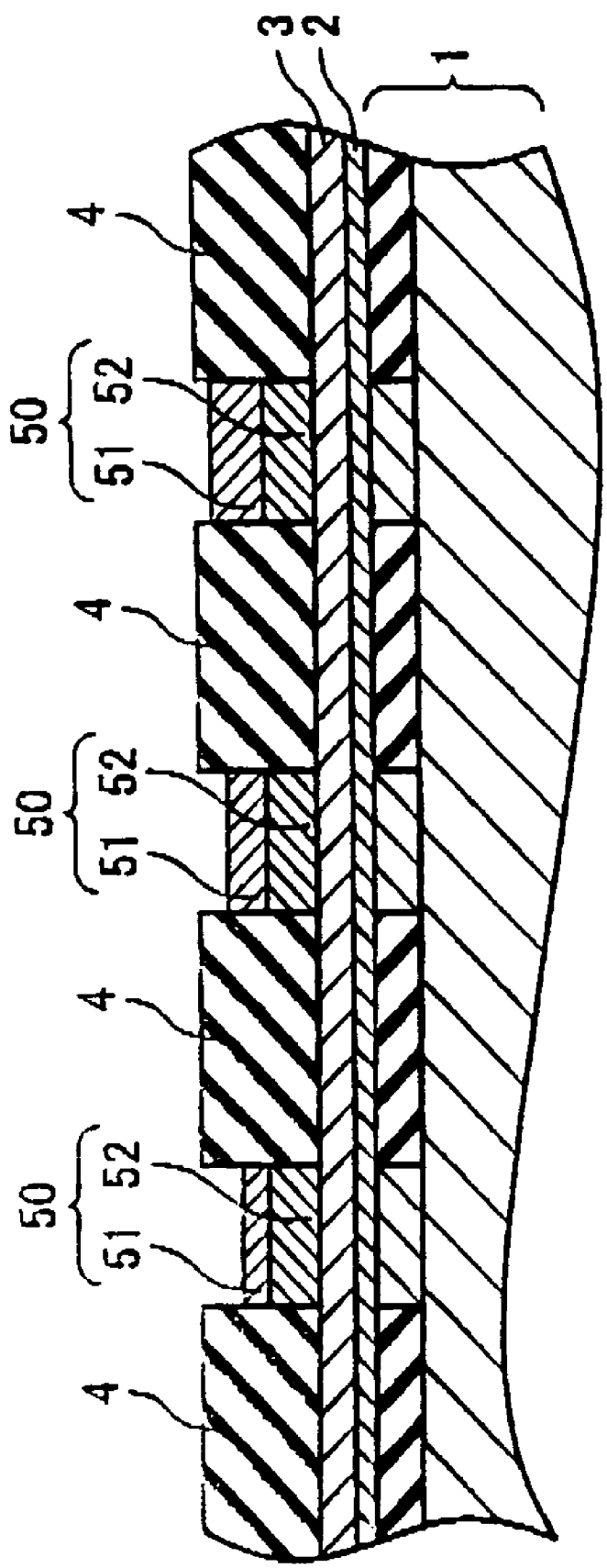
FIG. 10 is a sectional view of the semiconductor chip 1, where Au bumps 50 are formed.

Step S13:

Based on electrolytic plating with a current density of 1.5 A/dm$^2$, a first Au bump 51 is formed on the second Au bump 52 in the opening part 41. Hereinafter, the Au bump composed of the second Au bump 52 and the first Au bump 51 is referred to as an Au bump 50. FIG. 10 is a sectional view of the semiconductor chip 1, where the Au bumps 50 are formed. Referring to FIG. 10, the plurality of Au bumps 50 formed on the semiconductor chip 1 have mutually different heights. Height variation is greatly influenced by the first Au bumps 51 with a high current density.

Step S14:

In order to resolve the height variation, only surfaces of the first Au bumps 51 of the plurality of Au bumps 50 are processed to be flat by grinding. At this stage, each of the first Au bumps 51 is ground in such a manner as not to expose the top surface of the second Au bump 52 whose crystal direction is changed at high temperature.

Step S15:

The photoresist 4 is stripped based on an organic solvent or oxygen plasma ashing. The first Au bump 51 is formed with a current density of 1.5 A/dm$^2$ or above as is the case with the first Au bump 5 of the first embodiment, and thus its crystal direction is changed at low temperature. Therefore, crystal directions of the first Au bumps 51 are changed uniformly based on the thermal history (80 to 150° C.) of this process.

Step S16:

The seed film 3 and the barrier film 2 are removed by dry etching. The plurality of first Au bumps 51 are etched in the same manner when the seed film 3 and the barrier film 2 are dry-etched, but since their crystal directions are uniformly changed, there hardly arises a difference in etching rate, causing no etching nonuniformity. That is, the semiconductor device manufacturing method of the second embodiment of the present invention provides an effect of preventing the height variation among the plurality of first Au bumps 50.

As described above, according to the semiconductor device manufacturing method of the second embodiment of the present invention, the plurality of Au bumps 50 can be formed with their heights aligned. This, as is the case with the first embodiment, can suppress the connection failure upon bonding of the semiconductor chip 1 and the wiring board, thus providing an effect of improving the reliability of the semiconductor device. Further, according to the second embodiment of the present invention, the second Au bump 52 is formed with a current density of 1.0 A/dm$^2$ or below, thus keeping the height variation small. Therefore, the second embodiment of the present invention provides an effect of reducing the amount of Au used for forming the Au bump 50. Moreover, the small height variation among the Au bumps 50 makes it possible to shorten plating time and grinding time.

In the second embodiment of the present invention, for the formation of the Au bumps 50, two types of current density, i.e., 1.0 A/dm$^2$ or below and 1.5 A/dm$^2$ or above, are used. However, the current density is only required to be 1.5 A/dm$^2$ or above at the end of the Au bump 50 formation, and thus three or more stages of plating growth or a method of continuously increasing the current density is permitted.

Moreover, the Au plating has been described in this specification, but it is assumed that the same effects can be provided even by Cu plating or Ag plating. In the case of the Cu plating, a normal current density for electrolytic plating is 0.5 to 5.0 A/dm$^2$, and thus a manufacturing method of performing electrolytic plating with a high current density of 7.0 to 10.0 A/dm$^2$ is illustrated.

What is claimed is:

1. A manufacturing method of a semiconductor device, said method comprising:
   forming a seed film on a semiconductor chip;
   forming a photoresist having an opening above an electrode of the semiconductor chip on the seed film, such that in a plan view, edges of the opening coincide with edges of the electrode;
   forming a barrier film on an upper surface of the electrode, said barrier film extending from an edge of the semiconductor device to another edge of the semiconductor device;
   forming a first Au bump on the seed film in the opening by electrolytic plating with a current density of 1.5 A/dm$^2$ or above;
   grinding a surface of the first Au bump;
   stripping the photoresist; and
   removing the seed film by dry-etching,
   wherein said barrier film extends with a flat profile and parallel to the upper surface of the electrode from the edge of the semiconductor device to the another edge of the semiconductor device.

2. The manufacturing method of the semiconductor device according to claim 1, wherein the forming the first Au bump comprises:
   forming a second Au bump by electrolytic plating with a current density of 1.0 A/dm$^2$ or below, and
   wherein the first Au bump is formed on the second Au bump.

3. The manufacturing method of the semiconductor device according to claim 1, wherein in the stripping the photoresist, the photoresist is stripped by using an organic solvent or oxygen plasma ashing.

4. The manufacturing method of the semiconductor device according to claim 1, wherein the semiconductor chip is formed on a wafer,
   wherein an insulation layer is disposed on the wafer, and
   wherein the electrode is disposed inside the insulating layer.

5. The manufacturing method of the semiconductor device according to claim 4, wherein the upper surface of the electrode is co-planar with an upper surface of the insulation layer.

6. The manufacturing method of the semiconductor device according to claim 5, wherein a bottom surface of the electrode is co-planar with a bottom surface of the insulation layer.

7. The manufacturing method of the semiconductor device according to claim 5, wherein said barrier film forms a flat plate that extends on the upper surface of the electrode and the upper surface of the insulation layer.

8. The manufacturing method of the semiconductor device according to claim 7, wherein said forming the seed film comprises disposing the seed film on the barrier film such that the seed film extends parallel to the wafer from an edge of the wafer to another edge of the wafer.

9. The manufacturing method of the semiconductor device according to claim 1, wherein said forming the seed film comprises disposing the seed film on said barrier film such that the seed film extends parallel to the upper surface of the electrode from the edge of the semiconductor device to the another edge of the semiconductor device.

10. The manufacturing method of the semiconductor device according to claim 1, further comprising:
    forming a second Au bump by electrolytic plating in the opening such that, in the plan view, said edges of the electrode coincide with edges of the second Au bump.

11. The manufacturing method of the semiconductor device according to claim 1, further comprising:
    forming a plurality of ones of the first Au bump on the semiconductor chip, said plurality of ones of the first Au bump having mutually different heights.

12. A manufacturing method of a semiconductor device, said method comprising:
    forming a seed film on a semiconductor chip that comprises an electrode;
    forming a barrier film on an upper surface of the electrode, said barrier film extending from an edge of the semiconductor device to another edge of the semiconductor device;
    forming a photoresist having an opening, having edges aligned with edges of the electrode, above the electrode on the seed film;
    electrolytic plating an Au bump on the seed film in the opening;
    grinding a surface of the Au bump;
    stripping the photoresist; and
    dry-etching to remove the seed film,
    wherein said barrier film extends with a flat profile parallel to the upper surface of the electrode from the edge of the semiconductor device to the another edge of the semiconductor device.

13. The method of claim 12, wherein said electrolytic plating is performed with a current density of at least 1.5 A/dm$^2$.

14. The method of claim 12, wherein the semiconductor chip is formed on a wafer,
    wherein an insulation layer is disposed on the wafer, and
    wherein the electrode is disposed inside the insulating layer.

15. The method of claim 14, wherein the upper surface of the electrode is co-planar with an upper surface of the insulation layer, and
    wherein a bottom surface of the electrode is co-planar with a bottom surface of the insulation layer.

16. The method of claim 15, wherein said barrier film forms a flat plate on the upper surface of the electrode and the upper surface of the insulation layer.

17. The method of claim 16, wherein said forming the seed film comprises disposing the seed film on the barrier film such that the seed film extends parallel to the upper surface of the electrode from the edge of the semiconductor device to the another edge of the semiconductor device.

18. The method of claim 12, further comprising:
    forming a plurality of ones of the Au bump on the semiconductor chip, said plurality of ones of the Au bump having mutually different heights.

* * * * *